United States Patent
Ozaki et al.

(10) Patent No.: US 10,534,147 B2
(45) Date of Patent: Jan. 14, 2020

(54) OPTICAL TRANSCEIVER

(71) Applicant: MITSUBISHI ELECTRIC CORPORATION, Chiyoda-ku (JP)

(72) Inventors: Hiroyuki Ozaki, Chiyoda-ku (JP); Naoto Himura, Chiyoda-ku (JP); Shinya Nishi, Chiyoda-ku (JP); Masatoshi Katayama, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/302,231

(22) PCT Filed: Mar. 23, 2015

(86) PCT No.: PCT/JP2015/058744
§ 371 (c)(1),
(2) Date: Oct. 6, 2016

(87) PCT Pub. No.: WO2015/198667
PCT Pub. Date: Dec. 30, 2015

(65) Prior Publication Data
US 2017/0168254 A1    Jun. 15, 2017

(30) Foreign Application Priority Data

Jun. 27, 2014  (JP) .................. 2014-132769

(51) Int. Cl.
*G02B 6/42* (2006.01)
*H01S 5/022* (2006.01)
*H04B 10/40* (2013.01)

(52) U.S. Cl.
CPC ......... *G02B 6/4277* (2013.01); *G02B 6/4256* (2013.01); *G02B 6/4283* (2013.01); *H01S 5/022* (2013.01); *H04B 10/40* (2013.01)

(58) Field of Classification Search
CPC .. G02B 6/4277; G02B 6/4256; G02B 6/4283; G02B 6/36; G02B 6/42; G02B 6/4246;
(Continued)

(56) References Cited

U.S. PATENT DOCUMENTS 6,179,627 B1 * 1/2001 Daly .................. H01R 13/6658
439/354
6,376,396 B1 * 4/2002 Thorn .................... D04H 1/435
442/136
(Continued)

FOREIGN PATENT DOCUMENTS

JP    2007-286195 A    11/2007
JP    2009-105157 A    5/2009
(Continued)

OTHER PUBLICATIONS

International Search Report dated Jun. 23, 2015 in PCT/JP2015/058744 filed Mar. 23, 2015.
(Continued)

*Primary Examiner* — Abbas H Alagheband
(74) *Attorney, Agent, or Firm* — Oblon, McClelland, Maier & Neustadt, L.L.P.

(57) ABSTRACT

An optical transceiver includes an optical component (3) whose ground is integrated with a signal ground. The optical transceiver includes a conductor (51) that is electrically connected to the optical component (3), and a sheet-like insulator (52) disposed between the conductor (51) and a housing (1) such that a main surface thereof is positioned along an inner wall of the housing (1), and separating the signal ground and a frame ground on the side of the housing (1) from each other.

2 Claims, 5 Drawing Sheets

(58) Field of Classification Search
CPC ..... G02B 6/4292; G02B 6/4201; H01S 5/022; H04B 10/40; H04B 1/38; H04B 10/02; H04B 10/69; H01P 1/203; H01R 9/03; H05K 1/147; H05K 1/0219; H05K 1/0243; H05K 2201/10575; H05K 3/3447; H05K 2201/0715; H05K 2201/10121; H05K 1/162
USPC ..... 398/139; 385/94, 93, 89, 88, 85, 14, 92; 343/893, 853; 342/368, 354, 350
See application file for complete search history.

(56) References Cited

U.S. PATENT DOCUMENTS

| | | | | |
|---|---|---|---|---|
| 6,786,627 | B2* | 9/2004 | Takagi | G02B 6/4201 362/373 |
| 7,467,898 | B2* | 12/2008 | Nakazawa | G02B 6/4246 385/89 |
| 7,597,487 | B2* | 10/2009 | Kuo | G02B 6/4201 361/753 |
| 7,610,064 | B2* | 10/2009 | Mohamadi | H01Q 3/26 342/350 |
| 7,708,473 | B2* | 5/2010 | Tanaka | G02B 6/4201 385/88 |
| 7,811,007 | B2* | 10/2010 | Kunii | H05K 1/0243 385/88 |
| 8,267,599 | B2* | 9/2012 | Nguyen | G02B 6/4201 385/85 |
| 8,678,674 | B2* | 3/2014 | Kunii | H04B 10/40 385/92 |
| 8,907,749 | B2* | 12/2014 | Pajovic | H01P 1/20345 333/204 |
| 9,116,318 | B2* | 8/2015 | Fujimura | G02B 6/4275 |
| 9,507,108 | B2* | 11/2016 | Aoki | H05K 1/0204 |
| 2003/0063886 | A1* | 4/2003 | Seal | G02B 6/02176 385/134 |
| 2003/0063887 | A1* | 4/2003 | Seal | G02B 6/02176 385/134 |
| 2003/0190498 | A1* | 10/2003 | Fujieda | H01L 23/552 428/8 |
| 2004/0198079 | A1* | 10/2004 | Aronson | G02B 6/4201 439/76.1 |
| 2005/0281514 | A1* | 12/2005 | Oki | G02B 6/4201 385/92 |
| 2006/0204183 | A1* | 9/2006 | Ishikawa | G02B 6/4292 385/88 |
| 2007/0230878 | A1* | 10/2007 | Nakazawa | G02B 6/4246 385/92 |
| 2009/0123116 | A1* | 5/2009 | Tanaka | G02B 6/4201 385/92 |
| 2009/0239420 | A1* | 9/2009 | Nishio | G02B 6/4201 439/656 |
| 2009/0324238 | A1* | 12/2009 | Kunii | H05K 1/0243 398/135 |
| 2011/0081120 | A1* | 4/2011 | Nguyen | G02B 6/4201 385/92 |
| 2012/0288239 | A1* | 11/2012 | Fujimura | G02B 6/4275 385/92 |
| 2015/0326322 | A1* | 11/2015 | Ben-Bassat | H01Q 1/248 398/208 |

FOREIGN PATENT DOCUMENTS

| | | |
|---|---|---|
| JP | 2010-8673 A | 1/2010 |
| JP | 2012-8480 A | 1/2012 |
| JP | 2012-237841 A | 12/2012 |
| JP | 2013-54214 A | 3/2013 |
| JP | 2014-109604 A | 6/2014 |

OTHER PUBLICATIONS

Korean Office Action dated Sep. 29, 2017 in Korean Patent Application No. 10-2016-7036261 (with partial English translation).
Office Action dated May 9, 2018 in Chinese Patent Application No. 201580033405.8 with unedited computer generated English translation obtained from the Google Translation System.
Office Action dated Mar. 27, 2018 in Korean Patent Application No. 10-2016-7036261 (with unedited computer generated English translation) 10 pages.
Office Action dated Mar. 20, 2018 in Japanese Patent Application No. 2016-529115 (with English language translation).
Chinese Office Action dated Oct. 25, 2017 in Patent Application No. 201580033405.8 (with Partial English Translation).

* cited by examiner

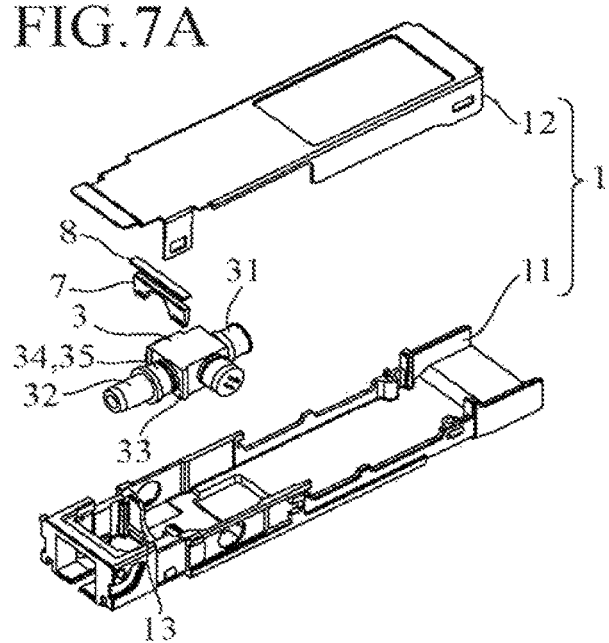
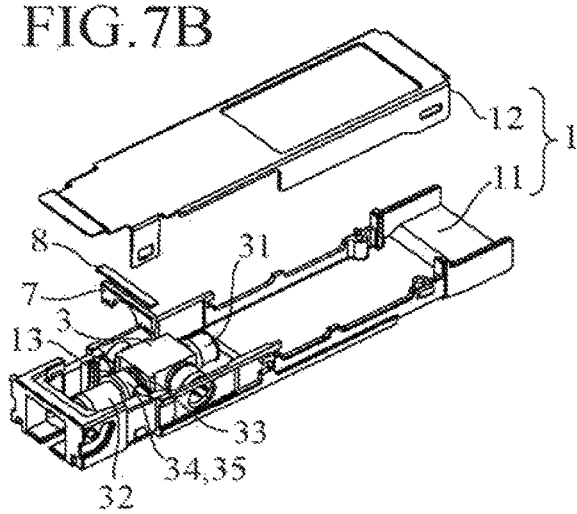
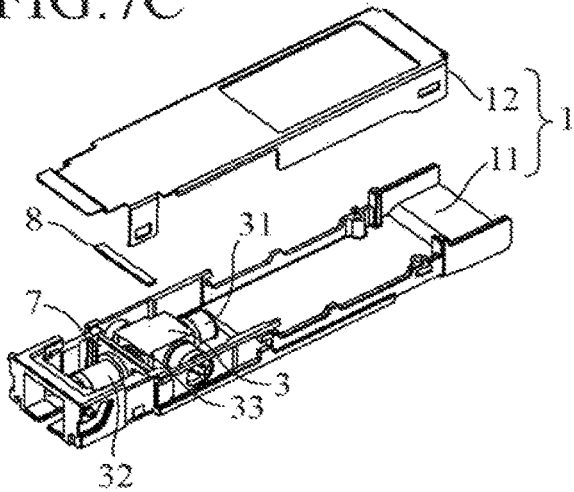
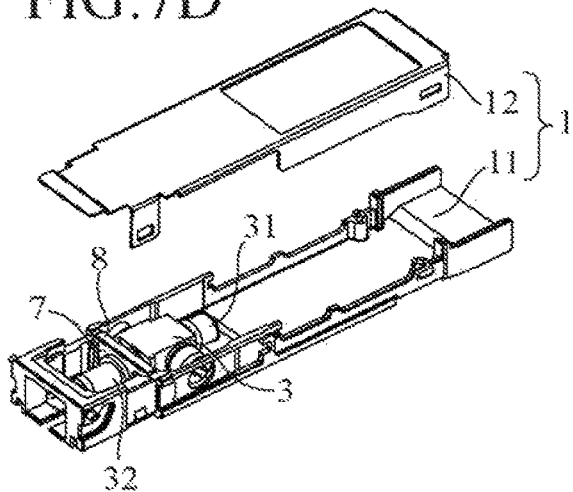
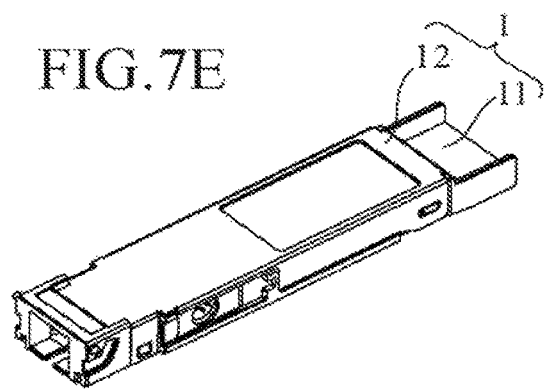

OPTICAL TRANSCEIVER

TECHNICAL FIELD

The invention relates to an optical transceiver which includes an optical component whose own ground is integrated with a signal ground, and in which countermeasures against EMI (Electro-Magnetic-Interference) are taken.

BACKGROUND ART

An optical transmitter-receiver (an optical transceiver) is an interface that is used in optical communications, and converts electricity into light. Conventionally, in an optical transceiver, an optical component having a box-type EML (Electro-absorption Modulated Laser diode) element is provided. Further, a board of the optical transceiver is connected to the EML element of the optical component via an FPC (flexible printed circuit board).

In such an optical transceiver, noise generated from the board is emitted to the inside of a housing from the FPC serving as a starting point, and hence it is necessary to suppress the emission of the noise to the outside.

In particular, in an optical transceiver that is compliant with 10GEPON having the transmission speed of 10 Gbps, noise of 10 GHz or higher is generated in the housing. As shown in FIG. 8, the noise of 10 GHz or higher passes through the housing (waveguide) of the optical transceiver without being attenuated, and hence the noise is easily emitted to the outside. Note that, FIG. 8 shows a transmission characteristic in the case where the noise is transmitted through the waveguide shown in FIG. 8 (the inner width a=6 mm, the inner height b=15 mm, and the total length L=100 mm).

Further, in the optical transceiver, an optical fiber is connected to an optical connector of the optical component, and each of the optical connector and a connection port of the optical fiber is composed of metal. In this case, when the optical fiber is connected to the optical connector, the metal of the optical connector and the metal of the connection port of the optical fiber function like an antenna. Thus, the optical transceiver unintentionally acquires a characteristic to emit noise to the outside.

On the other hand, in the optical transceiver, it is necessary to separate the ground on the side of the board (the signal ground) and the ground on the side of the housing (the frame ground) from each other because of specifications of the apparatus. On the contrary, in the box-type EML element used in conventional optical transceivers, its own ground is separated from the signal ground by providing a ceramic board in the connection portion with the FPC. With this, it is possible to separate the signal ground and the frame ground from each other.

In addition, in the optical transceiver that uses the box-type EML element, as countermeasures against the EMI, the optical component and the housing are physically (electrically) brought into direct contact with a conductive housing (see, e.g., Patent Document 1). Thus, by electrically grounding the optical component and the housing, it is possible to discharge noise from the FPC to the side of the housing to suppress the emission of the noise to the outside.

CITATION LIST

Patent Literature

Patent Document 1: U.S. Pat. No. 8,267,599B2

SUMMARY OF THE INVENTION

Technical Problem

In order to describe the invention in more detail, some embodiments for carrying out the present invention will be described below according to the accompanying drawings.

On the other hand, in the optical transceiver described above, cost reduction is required with an increase in transmission speed. Thus, instead of the box-type EML element, use of a CAN-type EML element that is less expensive is being discussed. However, in current CAN-type EML elements, its surface is covered with metal, and the ceramic board similar to the case of the box-type EML element is not provided. Accordingly, when the optical component and the housing of the optical transceiver are electrically grounded as in conventional cases as the countermeasures against the EMI, the signal ground is integrated with the frame ground via the optical component, and the specifications of the apparatus are violated. Therefore, there has been a problem that conventional countermeasures against the EMI cannot be taken.

The invention is made in order to solve the above problem, and an object thereof is to provide an optical transceiver that uses an optical component whose own ground is integrated with the signal ground and is capable of separating the signal ground and the frame ground from each other and obtaining an EMI characteristic.

Solution to Problem

The optical transceiver according to the present invention includes an optical component being stored in a housing and whose ground is integrated with a signal ground. The optical transceiver includes a conductor electrically connected to the optical component, and a sheet-like insulator disposed between the conductor and the housing such that a main surface thereof is positioned along an inner wall of the housing, and separating the signal ground and a frame ground on the side of the housing from each other.

In addition, the optical transceiver according to the present invention includes an optical component being stored in a housing and whose ground is integrated with a signal ground. The optical transceiver includes a conductor electrically connected to the optical component, and a sheet-like wave absorber disposed between the conductor and the housing such that a main surface thereof is positioned along an inner wall of the housing, and separating the signal ground and a frame ground on the side of the housing from each other.

Advantageous Effects of Invention

According to the present invention, since the above configuration is adopted, in the optical transceiver that uses an optical component whose own ground is integrated with the signal ground, it is possible to separate the signal ground and the frame ground from each other, and obtain the EMI characteristic.

BRIEF DESCRIPTION OF DRAWINGS

FIG. 7 shows exploded perspective views showing a configuration of the optical transceiver according to Embodiment 3 of the present invention, and shows steps of assembling an optical component.

DESCRIPTION OF EMBODIMENTS

Some embodiments of the present invention will be described in detail below with reference to the accompanying drawings.

Embodiment 1

Figure 1:
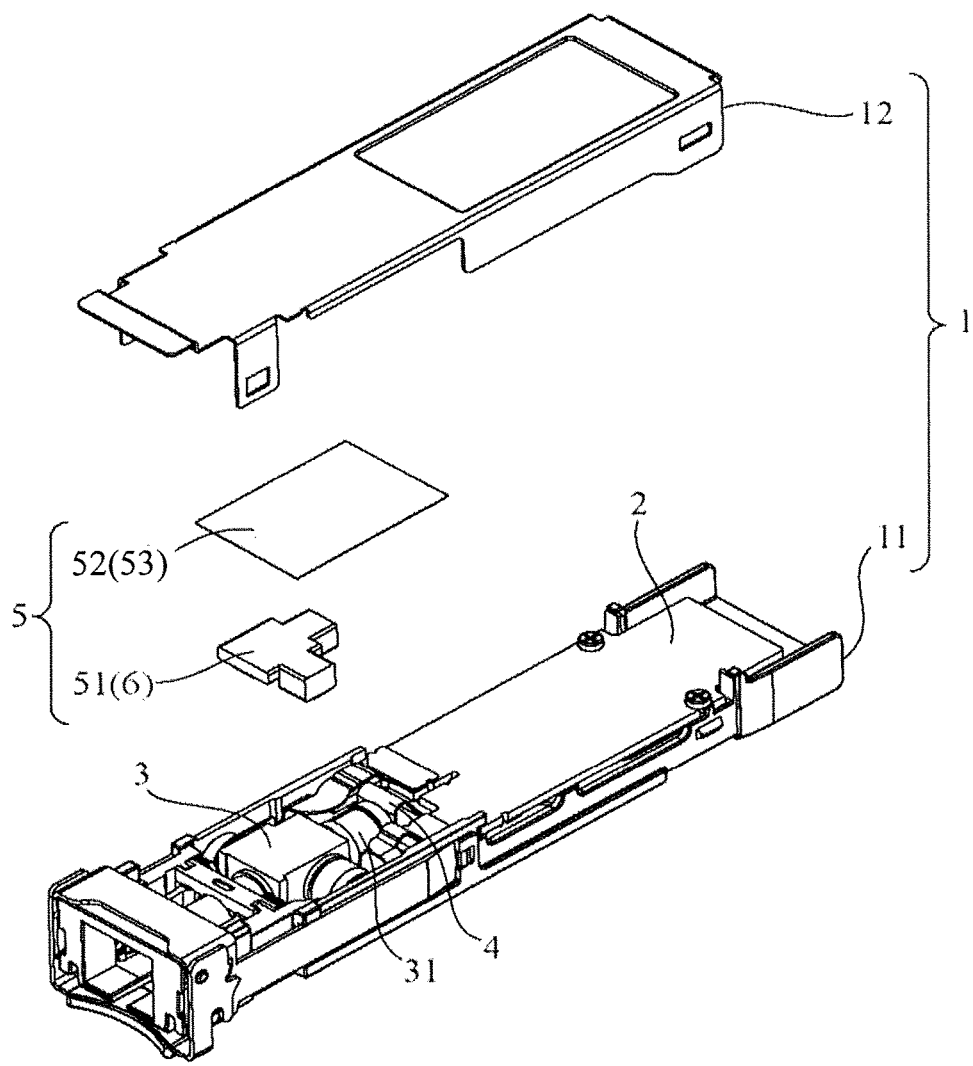
FIG. 1 is an exploded perspective view showing a configuration of an optical transceiver according to Embodiment 1 of the present invention.
Figure 2:
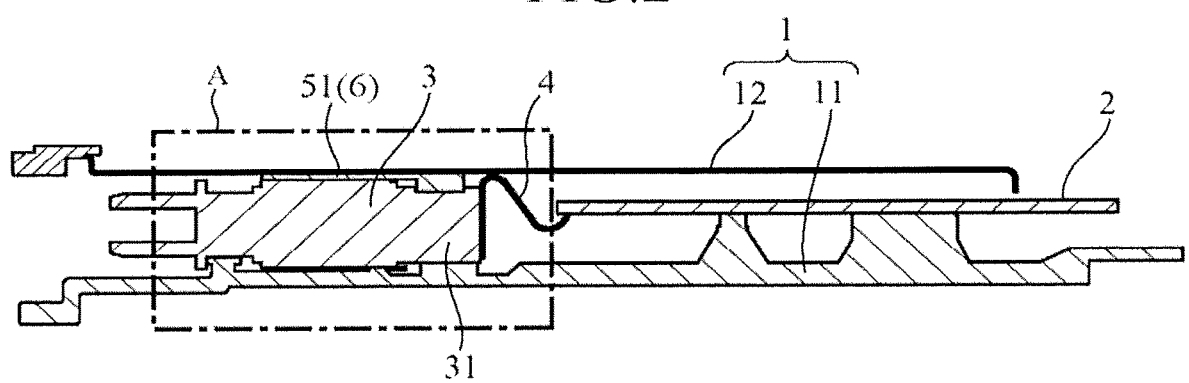
FIG. 2 is a cross-sectional side view showing the configuration of the optical transceiver according to Embodiment 1 of the present invention.
Figure 3:
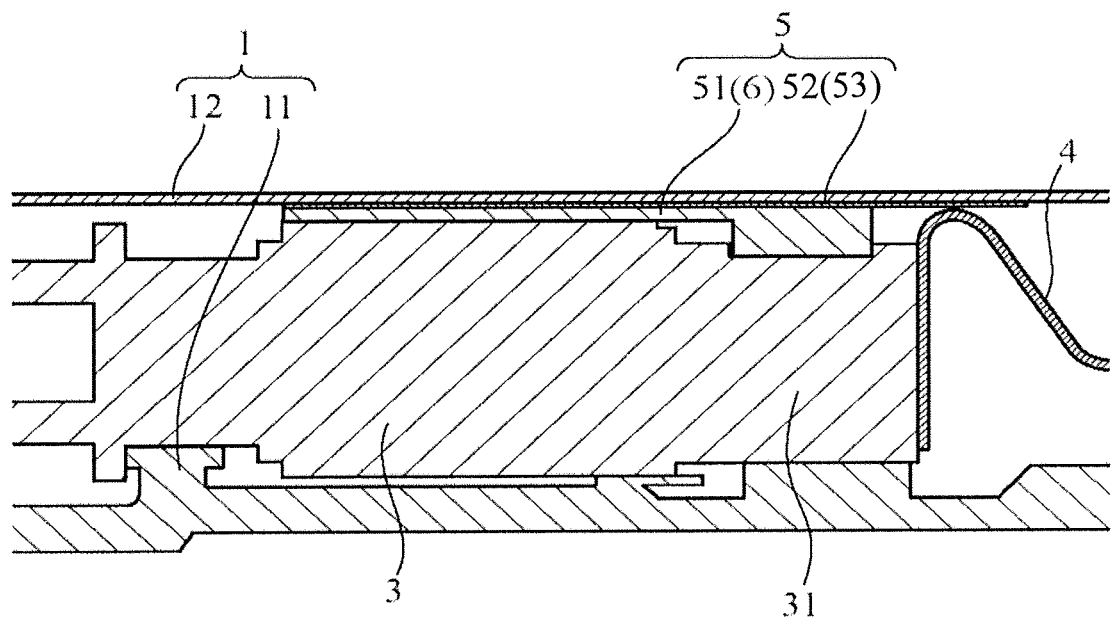
FIG. 3 is an enlarged view showing the A portion of FIG. 2.

FIG. 1 is an exploded perspective view showing a configuration of an optical transceiver according to Embodiment 1 of the present invention, FIG. 2 is a cross-sectional side view thereof, and FIG. 3 is an enlarged view showing the A portion of FIG. 2.

An optical transceiver is an interface that is used in optical communications, and converts electricity into light. As shown in FIGS. 1 to 3, in the optical transceiver, a board 2 and an optical component 3 are stored in a housing 1 consisting of a case 11 and a cover 12. The optical component 3 has an EML element 31 that includes a semiconductor element (for example, a semiconductor laser element such as, e.g., a laser diode). To the EML element 31 of the optical component 3, the board 2 is connected via an FPC 4.

Note that, an example in the drawings shows the case where a triplexer type optical component that has two CAN-type elements on its sides in addition to an EML element 31 is used as the optical component 3. In addition, in the example shown in the drawings, a CAN-type element is used as the EML element 31. That is, in the optical component 3 shown in the drawings, its own ground and a signal ground on the side of the board 2 cannot be separated to each other due to its structure and they are integrated.

In addition, in the optical transceiver, an EMI countermeasure structure 5 is provided. The EMI countermeasure structure 5 is used in order to suppress emission of noise that is generated by the board 2 and emitted from the FPC 4 serving as a starting point to the outside. The EMI countermeasure structure 5 is constituted by a conductor 51 and a sheet-like insulator 52. Note that, the example in the drawings shows a case where it is assumed that the noise passes along an upper surface side in the housing 1, and the EMI countermeasure structure 5 is provided on a surface of the housing 1 closest to the passing noise (the upper surface side in the housing 1).

The conductor 51 is electrically connected to the optical component 3. In the example shown in the drawings, as the conductor 51, a gasket 6 provided for positional regulation (vibration suppression) of the optical component 3 in the housing 1 is used. The surface of the gasket 6 is plated with nickel or the like.

In addition, the insulator 52 is a sheet-like member that is disposed between the conductor 51 and the housing 1 such that a main surface thereof is positioned along an inner wall of the housing 1, and separates the signal ground and a frame ground on the side of the housing 1 from each other. The insulator 52 is made of, e.g., polyester, polyimide, or the like. The thickness of the insulator 52 is preferably ¼ wavelength or less of the noise frequency generated in the housing 1.

By disposing the conductor 51 and the sheet-like insulator 52 between the optical component 3 and the housing 1 as described above, the surface resistance of the conductor 51 is increased due to the thin layer of the insulator 52, so that it is possible to obtain a filtering effect for the noise passing through the housing 1.

Figure 4:
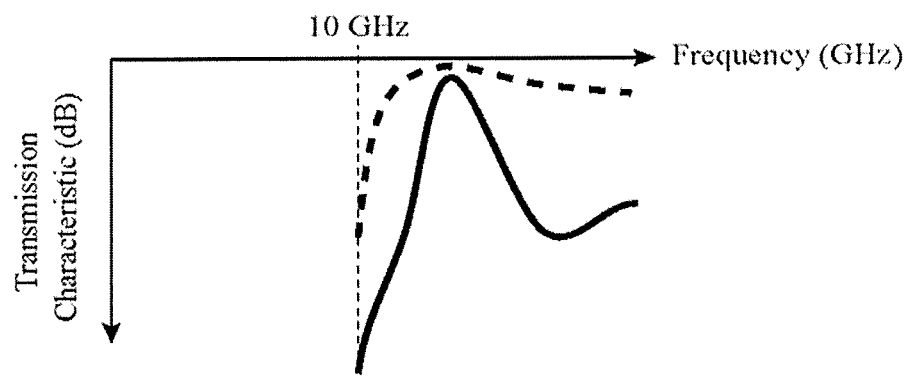
FIG. 4 is a view for explaining an effect of the optical transceiver according to Embodiment 1 of the present invention.

FIG. 4 is a view for explaining an effect of the present invention, and shows a relationship between the frequency and the transmission characteristic of the noise generated in the housing 1. In FIG. 4, the broken line indicates the case where the EMI countermeasure structure 5 of the present invention is not provided between the optical component 3 and the housing 1, and the solid line indicates the case where the EMI countermeasure structure 5 of the present invention is provided. From FIG. 4, it can be seen that the noise passing through the housing 1 can be suppressed by providing the EMI countermeasure structure 5 of the present invention. Note that, the amount of the suppression is sufficient as the EMI characteristic required for the optical transceiver. As a result, it is possible to suppress the emission of the noise to the outside.

Figure 5:
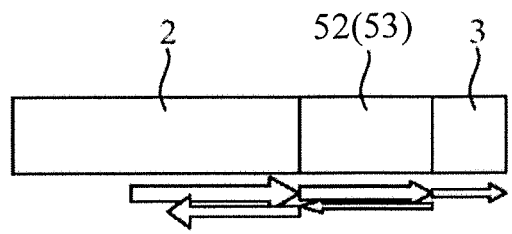
FIG. 5 is a view showing a difference in the transmission mode of noise in each area in the optical transceiver according to Embodiment 1 of the present invention.
Figure 6:
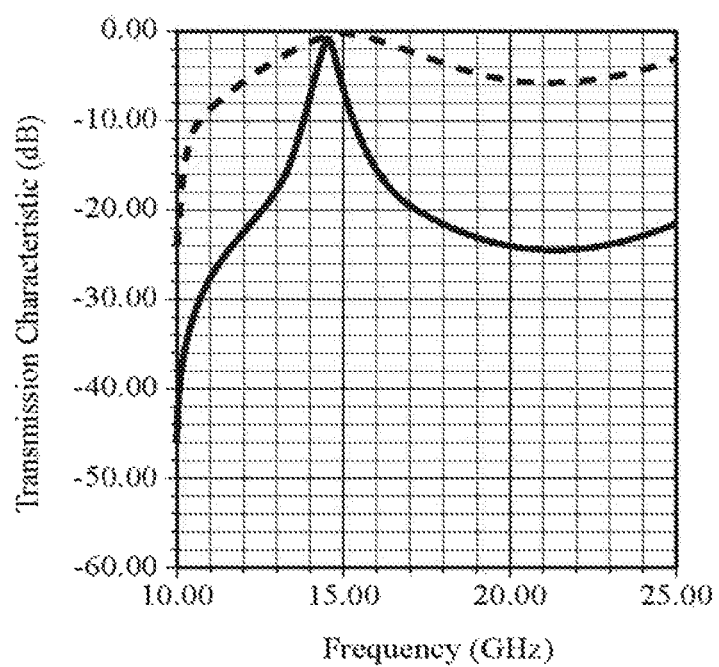
FIG. 6 is a view for explaining a difference in effect in the cases where the thickness of an insulator is changed in the optical transceiver according to Embodiment 1 of the present invention.
Figure 8:
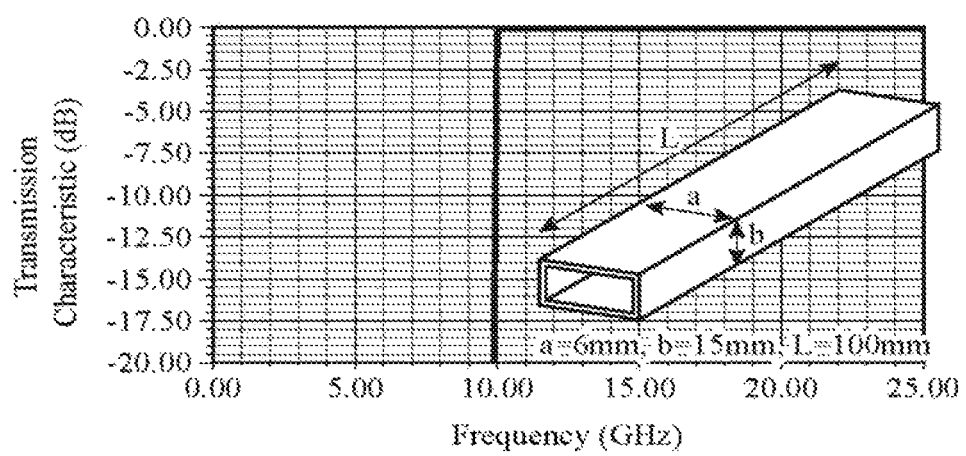
FIG. 8 is a view showing a relationship between a frequency and the transmission characteristic of noise that passes through a housing (waveguide) of the optical transceiver.

Further, FIG. 5 is a view showing a difference in the transmission mode of the noise in each area in the optical transceiver (the area of the board 2, the area of the insulator 52, and the area of the optical component 3 beyond the insulator 52). FIG. 6 is a view for explaining a difference in effect in the cases where the thickness of the insulator 52 is changed, and shows the relationship between the frequency and the transmission characteristic of the noise generated in the housing 1. In FIG. 6, the broken line indicates the case where the thickness of the insulator 52 is set to 1 mm, and the solid line indicates the case where the thickness of the insulator 52 is set to 0.1 mm.

As indicated by arrows in FIG. 5, the transmission mode of the noise differs among the areas in the optical transceiver, and a mismatch is caused at the boundary therebetween. The thinner the thickness of the insulator 52 is, (the smaller the thickness thereof is comparing with ¼ wavelength of the noise frequency generated in the housing 1), the higher the ratio of the mismatch is, and it is possible to obtain good filtering effect as shown in FIG. 6.

In addition, plating process is applied to the surface of the housing 1 so that higher filtering effect can be obtained. At this process, it is further preferable to plate the surface with material having a large surface resistance value such as, e.g., nickel.

That is, noise transmits through a surface conductor formed on the surface of the housing 1. Then, the current density of the noise is large at the surface of the surface conductor, and is decreased in a region apart from the surface (skin effect). In addition, the depth of the surface conductor in the cross-sectional direction at which the current becomes 1/e (about 0.37) times the current at the surface is referred to as the skin depth, and the skin depth is represented by $\sqrt{(1/(\pi\sigma\mu f))}$ [m]. Here, σ is the conductivity of the surface conductor, μ is the permeability of the surface conductor, and f is the frequency of the noise. The permeability of nickel is higher than those of gold, silver, and copper so that the skin depth is shallow, and the cross-sectional area of the surface conductor through which the noise flows is reduced, and hence the transmission loss of the noise is increased and it is possible to obtain higher filtering effect.

Further, since the surface of the housing 1 of the optical transceiver is usually plated with nickel, the number of additional manufacturing steps and the cost are not increased.

Thus, according to Embodiment 1, since the conductor 51 and the sheet-like insulator 52 are disposed between the optical component 3 and the housing 1, in the optical transceiver that includes the optical component 3 having its own ground integrated with the signal ground, it is possible to separate the signal ground and the frame ground from each other and obtain the EMI characteristic.

In addition, by setting the thickness of the insulator 52 to ¼ wavelength or less of the noise frequency generated in the housing 1, it is possible to obtain higher filtering effect.

Further, by applying plating process to the surface of the housing 1 (with material having a large surface resistance value such as nickel in particular), it is possible to obtain even higher filtering effect.

Moreover, in the example described above, the CAN-type EML element is used as the EML element 31. Accordingly, it is possible to constitute the optical transceiver less expensively than in the case where the box-type EML element 31 is used.

Note that, in the above example, the EMI countermeasure structure 5 of the present invention is applied to the case where the CAN-type EML element 31 is used and so that the EMI characteristic is obtained is described. However, the present invention is not limited to such a structure. The EMI countermeasure structure 5 of the present invention can also be applied to other optical transceivers that use the optical component 3 having its own ground integrated with the signal ground, and it is possible to obtain the same effects as those described above.

For example, in the triplexer type optical component 3, even when the EML element 31 is box-type and it is possible to separate its own ground and the signal ground from each other on the EML element 31 side, there are cases where the ground separation cannot be performed in other elements. In such cases, conventional countermeasures against the EMI cannot be used because the signal ground is integrated with the frame ground. However, even in such cases, it is possible to use the EMI countermeasure structure 5 of the present invention and obtain the same effects as that described above.

Further, in the example shown in the drawings, a triplexer type optical component 3 having three CAN-type elements is used. However, the number of elements is not limited thereto, the optical component 3 of any type may be used, and even in such cases, it is possible to adopt the EMI countermeasure structure 5 of the present invention.

In addition, in the example shown in the drawings, the case where the conductor 51 (the gasket 6) consists of one plate material is described. However, the conductor 51 is not limited thereto, and the conductor 51 that is divided into a plurality of portions according to the difference in height between various portions of the optical component 3 may also be used.

Moreover, in the example shown in the drawings, the case where the EMI countermeasure structure 5 is provided only on the surface (the upper surface side in the housing 1) closest to the noise passing through the housing 1 is described. In contrast to this, the EMI countermeasure structure 5 constituted by the conductor 51 and the sheet-like insulator 52 may also be provided on other surfaces of the housing 1.

Embodiment 2

In Embodiment 1, a case where the conductor 51 and the sheet-like insulator 52 are disposed between the optical component 3 and the housing 1 is described. Alternatively, the sheet-like insulator 52 may be replaced with a sheet-like wave absorber 53. Note that, the thickness of the wave absorber 53 is preferably ¼ wavelength or less of the noise frequency generated in the housing 1 similarly to the insulator 52 in Embodiment 1. Thus, by using the wave absorber 53 instead of the insulator 52, in addition to the effects in Embodiment 1, a noise absorption effect by the wave absorber 53 is obtained, and hence the EMI characteristic is further improved.

Embodiment 3

In the configurations shown in the above Embodiments 1 and 2, by disposing the conductor 51 and the sheet-like insulator 52 (or the wave absorber 53) between the optical component 3 and the housing 1, the signal ground and the frame ground are separated from each other, and the EMI characteristic is obtained. On the other hand, Embodiment 3 describes a configuration for preventing the noise generated in the housing 1 from being emitted from an optical connector 32 of the optical component 3.

FIG. 7 shows exploded perspective views of the configuration of the optical transceiver according to Embodiment 3 of the invention, and shows steps of assembling the optical component 3. Note that, in the optical transceiver shown in FIG. 7, the board 2, the FPC 4, and the EMI countermeasure structure 5 are the same as those in Embodiments 1 and 2, and the depiction and description thereof will be omitted.

As shown in FIG. 7, the optical component 3 has the optical connector 32 to which an optical fiber (not shown) is connected. In addition, a second insulator 33 that insulates a main body portion of the optical component 3 and the optical connector 32 from each other is provided between the main body portion of the optical component 3 and the optical connector 32. Further, in the case 11 of the housing 1, a rib 13 for holding a receptacle 34 of the optical component 3 and regulating the position of the optical component 3 is provided.

In addition, a conductive first elastic member 35 for electrically connecting the receptacle 34 to the rib 13 of the case 11 is wound around the receptacle 34 of the optical connector 32. Further, on the upper side of the receptacle 34 held by the rib 13, a metal member 7 that is electrically connected to the receptacle 34 via the first elastic member 35 by being inserted so as to pinch both side surfaces of the rib 13 is provided. In addition, on the upper side of the metal member 7, a conductive second elastic member 8 that electrically connects the metal member 7 and the cover 12 of the housing 1 is provided.

The rib 13, the first and second elastic members 35 and 8, and the metal member 7 constitute a second conductor that electrically connects the receptacle 34 of the optical connector 32 and the housing 1. Note that, FIG. 7 shows a case where the receptacle 34 and the housing 1 are electrically connected without any gap, but they may be appropriately connected at least at four or more positions.

In the case where the optical member 3 is mounted to the housing 1, first, as shown in FIGS. 7(a) and 7(b), the optical component 3 is stored in the case 11, and the receptacle 34 is electrically connected to the rib 13 via the first elastic member 35. Subsequently, as shown in FIG. 7(c), by inserting the metal member 7 such that the metal member 7 pinches both side surfaces of the rib 13, the receptacle 34 is electrically connected to the metal member 7 via the first elastic member 35. Then, as shown in FIGS. 7(d) and 7(e), by disposing the second elastic member 8 on the metal member 7 and attaching the cover 12, the metal member 7 is electrically connected to the cover 12. In this manner, by electrically connecting the receptacle 34 of the optical connector 32 and the housing 1 at least at four or more positions, it is possible to discharge the noise flown to the side of the optical connector 32 of the optical component 3 to the side of the housing 1, so that the emission of the noise to the outside can be suppressed.

Thus, according to this Embodiment 3, since the main body portion of the optical component 3 and the optical connector 32 are insulated from each other by the second insulator 33, and the receptacle 34 of the optical connector 32 and the housing 1 are electrically connected at least at four positions or more by the second conductor, in addition to the effects in Embodiments 1 and 2, it is possible to prevent the noise generated in the housing 1 from being emitted from the optical connector 32. The configuration of Embodiment 3 is effective in a case where it is necessary to electrically separate the main body portion of the optical component 3 from the housing 1.

Note that, the example in FIG. 7 shows the case where the second conductor is constituted by the rib 13, the first and second elastic members 35 and 8, and the metal member 7. However, the second conductor is not limited to such a configuration, and the second conductor may be appropriately constituted so as to electrically connect the receptacle 34 of the optical connector 32 and the housing 1 without gap.

In addition, it is possible to freely combine the embodiments, modify any components of the embodiments, or omit any components in the embodiments within the scope of the invention.

INDUSTRIAL APPLICABILITY

The optical transceiver according to the present invention includes an optical component stored in a housing and whose own ground is integrated with a signal ground. The optical transceiver is constituted to include: a conductor electrically connected to the optical component and; a sheet-like insulator that is disposed between the conductor and the housing such that a main surface thereof is positioned along the inner wall of the housing and separates the signal ground and the frame ground on the housing side from each other. Hence, the optical transceiver is capable of obtaining the EMI characteristic and is suitable for optical communications.

REFERENCE SIGNS LIST

1: housing
2: board
3: optical component
4: FPC
5: EMI countermeasure structure
6: gasket
7: metal member
8: second elastic member
11: case
12: cover
13: rib
31: EML element
32: optical connector
33: second insulator
34: receptacle
35: first elastic member
51: conductor
52: insulator
53: wave absorber

The invention claimed is:

1. An optical transceiver including an optical component, being stored in a housing and whose own ground is integrated with a signal ground, the optical transceiver comprising:
a conductor configured to cover one surface of the optical component, the conductor being electrically connected to the optical component; and
a sheet-like insulator whose upper surface is disposed between the conductor and the housing in such a manner that the upper surface of the sheet-like insulator is positioned along an inner wall of a surface proximate to noise passing through the housing, the sheet-like insulator being configured to separate the signal ground and a frame ground on the side of the housing from each other,
wherein the optical component, the conductor, the sheet-like insulator, and the housing are stacked to form a layer composed of the optical component, the conductor, the sheet-like insulator, and the housing.

2. An optical transceiver including an optical component, being stored in a housing and whose own ground is integrated with a signal ground, the optical transceiver comprising:
a conductor configured to cover for covering one surface of the optical component, the conductor being electrically connected to the optical component; and
a sheet-like wave absorber whose upper surface is disposed between the conductor and the housing in such a manner that the upper surface of the sheet-like wave absorber is positioned along an inner wall of a surface proximate to noise passing through the housing, the sheet-like wave absorber being configured to separate the signal ground and a frame ground on the side of the housing from each other,
wherein the optical component, the conductor, the sheet-like wave absorber, and the housing are stacked to form a layer composed of the optical component, the conductor, the sheet-like wave absorber, and the housing.

* * * * *